(12) United States Patent
Wang

(10) Patent No.: US 10,193,635 B2
(45) Date of Patent: Jan. 29, 2019

(54) LOW-POWER APD BIAS CONTROLLER, BIAS CONTROL METHOD, AND PHOTOELECTRIC RECEIVER

(71) Applicant: InnoLight Technology (Suzhou) LTD., Suzhou, Jiangsu (CN)

(72) Inventor: Xiangzhong Wang, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 364 days.

(21) Appl. No.: 15/070,400

(22) Filed: Mar. 15, 2016

(65) Prior Publication Data
US 2016/0273959 A1   Sep. 22, 2016

(30) Foreign Application Priority Data

Mar. 16, 2015   (CN) .......................... 2015 1 0113780

(51) Int. Cl.
G01J 1/02 (2006.01)
G01J 1/44 (2006.01)
H04B 10/69 (2013.01)
H01L 31/02 (2006.01)

(52) U.S. Cl.
CPC .... H04B 10/6911 (2013.01); H01L 31/02027 (2013.01); *G01J 2001/444* (2013.01); *G01J 2001/4466* (2013.01)

(58) Field of Classification Search
CPC .. H04B 10/6911; H04B 10/691; H04B 10/69; H01L 31/02027; G01J 2001/444; G01J 2001/4446; G01J 2001/446; G01J 2001/4466
See application file for complete search history.

(56) References Cited

U.S. PATENT DOCUMENTS 6,031,219 A * 2/2000 Shuke ................ H04B 10/6911
                                                    250/214 A
6,396,614 B1 * 5/2002 Yoshizawa ......... H04B 10/6911
                                                    250/214 A
6,894,266 B2 * 5/2005 Richard ........... H03K 19/00369
                                                    250/214 LA
7,071,455 B2 * 7/2006 Irie .......................... H03F 3/08
                                                    250/214 R (Continued)

FOREIGN PATENT DOCUMENTS

CN         1790946 A       6/2006
CN       201256288 Y       6/2009

*Primary Examiner* — John Lee
(74) *Attorney, Agent, or Firm* — Finnegan, Henderson, Farabow, Garrett & Dunner, LLP

(57) ABSTRACT

An avalanche photodiode (APD) bias control method may include acquiring a photocurrent intensity voltage and generating a control signal by superposing the acquired photocurrent intensity voltage and a bias setting signal, wherein the control signal controls a voltage drop between an adjustable power supply output voltage and a voltage of the APD. The APB bias control method may further include adjusting the adjustable power supply output voltage and the bias setting signal simultaneously so that the voltage drop is within a target voltage drop range and the APD bias voltage approaches a bias voltage that corresponds to an APD optical input power. An avalanche photodiode (APD) bias controller and an avalanche photodiode (APD) photoelectric receiver are also provided.

18 Claims, 9 Drawing Sheets

(56) References Cited

U.S. PATENT DOCUMENTS

| | | | |
|---|---|---|---|
| 7,332,702 B2* | 2/2008 | Nishiyama | H04B 10/6911 250/214 C |
| 2001/0032921 A1* | 10/2001 | Forsberg | G01J 1/18 250/214.1 |
| 2004/0079866 A1* | 4/2004 | Nishiyama | H04B 10/6911 250/214 R |
| 2005/0001150 A1* | 1/2005 | Yonemura | H04B 10/6911 250/214 R |
| 2007/0057160 A1* | 3/2007 | Kaku | G01J 1/4257 250/214 R |
| 2007/0248357 A1* | 10/2007 | Fediakine | H04B 10/564 398/27 |
| 2008/0017785 A1* | 1/2008 | Byren | H04B 10/6911 250/214 R |
| 2008/0138092 A1* | 6/2008 | Nagakubo | H04B 10/6911 398/202 |
| 2008/0308716 A1* | 12/2008 | Byren | H04B 10/6911 250/214 R |
| 2009/0236502 A1* | 9/2009 | Ishii | H03G 3/3084 250/214 R |
| 2009/0238582 A1* | 9/2009 | Tsunoda | H01L 31/02027 398/208 |
| 2010/0316394 A1* | 12/2010 | Koiwai | H04B 10/6911 398/208 |
| 2012/0193519 A1* | 8/2012 | Oomori | H04B 10/6911 250/214.1 |
| 2016/0273959 A1* | 9/2016 | Wang | H01L 31/02027 |

* cited by examiner

LOW-POWER APD BIAS CONTROLLER, BIAS CONTROL METHOD, AND PHOTOELECTRIC RECEIVER

CROSS-REFERENCE TO RELATED APPLICATION

This application claims the benefit of priority to Chinese Application No. CN 201510113780.5, filed Mar. 16, 2015.

FIELD OF THE DISCLOSURE

The present disclosure relates to the field of optical communication and, more specifically, the field of low-power APD (avalanche photodiode) bias controllers, APD bias control methods, and APD photoelectric receivers.

BACKGROUND

Patent 1 and Patent 2, which disclose technologies relevant to APD bias controllers, are described below.

Patent 1 (Chinese Patent Publication No.: CN1790946A) discloses an optical receiving module with overload protection for use in optical fiber communication. It comprises an avalanche photodiode, a DC/DC step-up circuit that provides a reverse bias voltage to the avalanche photodiode, and a sampling resistor for optical input detection; one end of the sampling resistor is connected to the output end of the DC/DC step-up circuit, a current-limiting protective resistor is serially connected between the other end of the sampling resistor and the pin of the reverse bias voltage of the avalanche photodiode, and the resistance of the current-limiting protective resistor is greater than the resistance of the sampling resistor.

In this patent, a serially connected resistor is used for the bias voltage, and the output voltage of the step-up circuit does not automatically adjust based on the level of the APD photocurrent; when the photocurrent approaches the overload point, the output power is relatively high, and most of the power is wasted on the current-limiting resistor. In multichannel APD applications, the waste of power is even greater.

Patent 2 (Chinese Patent Publication No.: CN201256288Y) discloses an avalanche photodiode bias device and circuit, wherein the device comprises a power supply unit, an avalanche photodiode, and a feedback component; the input end of the feedback component is connected to the output end of the power supply unit, the first output end of the feedback component is connected to the input end of the power supply unit; and the second output end of the feedback component is connected to the input end of the APD. Through the provision of bias overload to the avalanche photodiode, this utility model patent prevents the chip of the avalanche photodiode from burning out, improving the safety and repair cost of avalanche photodiode receivers.

In this patent, APD protection is provided through adjustment of the bias voltage by electrical current feedback; it has a small dynamic range and may not play a protective role. The response time through the DC/DC step-up circuit is usually 0.1 ms-10 ms; when the optical input power increases instantaneously in a time period shorter than the response time of the DC/DC step-up circuit, photocurrent overload and TIA bit errors will occur, and the APD/TIA may be damaged by the overload.

SUMMARY

Embodiments of the present disclosure may provide an APD bias control method and a corresponding device that can solve the aforementioned problems and is low in power consumption and high in dynamic response speed.

According to one of its aspects, embodiments of the present disclosure may provide an APD bias control method comprising: acquisition of the photocurrent intensity voltage $V_{fb}$ that corresponds to the photocurrent signal $I_{apd}$ that flows through the APD; generation of control signal $V_{2nd}$ by superposing the acquired photocurrent intensity voltage $V_{fb}$ and bias setting signal $V_{set}$, for the purpose of controlling the voltage drop $V_{drop}$ $(=V_0-V_{apd})$ between the output voltage $V_0$ of the adjustable power supply and the voltage of the APD; and simultaneous adjustment of the adjustable power supply output voltage $V_0$ and bias setting signal $V_{set}$, to control the voltage drop so that it falls within the target voltage drop range set in advance (e.g., 0.82V+/−0.32V) and to make the APD bias voltage $V_{apd}$ gradually approach and then stabilize at the bias voltage value that corresponds to the current optical input power Pin.

Optionally, in the APD bias control method, the bias setting signal controls the voltage drop independent from the photocurrent intensity voltage; the greater the bias setting signal or photocurrent intensity signal is, the greater the voltage drop is; and the operating point of the APD is made to fall within its safe operating range.

Optionally, the APD bias control method also may comprise: temperature calibration and temperature compensation steps, wherein the temperature calibration steps may comprise: selecting typical operating temperature points within the rated operating temperature range of the APD; under typical operating temperature point, calibrating the initial value of the adjustable power supply output voltage and then the initial value of the bias setting signal, to establish a table showing the relationship between the initial value of the adjustable power supply output voltage and the APD operating temperature and a separate table showing the relationship between the initial value of the bias setting signal and the APD operating temperature ("temperature relationship tables"); wherein the temperature compensation steps comprise: acquiring the current APD operating temperature; and according to the temperature relationship tables, determining the initial value of the adjustable power supply output voltage and the initial value of the bias setting signal under the current APD temperature for the purpose of controlling the voltage drop.

Further and optionally, the APD bias control method may also comprises steps to calibrate the initial value of the adjustable power supply output voltage and the initial value of the bias setting signal, wherein the calibration steps comprise: setting the APD optical input power to be slightly below its sensitivity target, change the adjustable power supply output voltage; adjusting the bias setting signal to control the voltage drop at its target value; measuring the bit error rate of the APD receiver; and identifying the adjustable power supply output voltage value and bias setting signal value corresponding to the lowest bit error rate and take them as the initial values for the adjustable power supply output voltage and bias setting signal, respectively.

Optionally, the APD bias control method may also comprise steps to generate indicators of power supply voltage states, wherein the steps to generate indicators of power supply voltage states may comprise: generating an undervoltage indicator signal when the voltage drop is smaller than the target voltage drop range; generating an overvoltage indicator signal when the voltage drop is greater than the target voltage drop range.

Optionally, the APD bias control method may also comprise an auxiliary power supply and power supply switchover steps, wherein the auxiliary power supply and power supply switchover steps may comprise: connecting the auxiliary power supply to supply power for the APD when the voltage drop is smaller than the lower end of the target voltage drop range; and disconnecting the auxiliary power supply when the voltage drop is higher than or equal to the lower end of the target voltage drop range, so that the adjustable power supply is the sole power supply for the APD.

In another aspect, the embodiments of the present disclosure may provide a low-power APD bias controller, which may comprise: a bias voltage generating unit, which is used to generate a bias voltage to determine the APD's bias voltage based on an external photocurrent intensity feedback signal. In addition, a second voltage is generated in the unit, and the second voltage is compared to one or more reference voltages to generate an undervoltage or overvoltage indicator that indicates whether the current adjustable power supply voltage is too low or too high.

Optionally, the bias voltage generating unit of the low-power APD bias controller may also comprise a bias setting signal port, wherein the bias setting signal is used to precisely set the level of the bias voltage independent from the photocurrent intensity feedback signal.

Optionally, the low-power APD bias controller may also comprise: a voltage follower unit, comprising a first port that can be connected to the adjustable power supply, a second port that can be used to provide a load voltage to the APD load circuit, and a third input voltage port, wherein the voltage follower unit is used to make the load voltage change as the input voltage changes.

Optionally, the low-power APD bias controller may also comprise: a bias voltage adjusting unit, which is used to generate a control signal based on the undervoltage or overvoltage indicator from the bias voltage generating unit; the control signal can be used to control voltage of the adjustable power supply so that it meets the minimum voltage requirement for the APD to operate normally, which in turn minimizes the output voltage of the power supply.

Optionally, the control signal is also used to control and stabilize the bias voltage in the process of controlling the adjustable power supply voltage.

Optionally, the low-power APD bias controller may also comprise: a power supply switchover unit, which is used to connect the auxiliary power supply to supply power for the APD based on the undervoltage indicator from the bias voltage generating unit and to disconnect the auxiliary power supply when the adjustable power supply is out of the undervoltage state so that the adjustable power supply is the sole power supply for the APD.

Optionally, the low-power APD bias controller may also comprise: a temperature compensation unit, which is used to increase or decrease the level of the bias voltage based on changes in temperature, and to provide temperature compensation to the APD's bias voltage so that the APD maintains the optimal bias voltage within its operating temperature range.

In another aspect, the embodiments of the present disclosure may also provide an APD photoelectric receiver comprising an APD component, a trans-impedance pre-amplifier serially connected to the APD component, a photocurrent detecting unit, and an adjustable power supply, wherein the APD photoelectric receiver may also comprise: a voltage follower unit, comprising a first port that can be connected to the adjustable power supply, a second port that can be used to provide a load voltage to the APD load circuit, and a third input voltage port, wherein the voltage follower unit is used to make the load voltage change as the input voltage changes; a bias voltage generating unit, which is used to generate a bias voltage to determine the APD's bias voltage based on an external photocurrent intensity feedback signal. In addition, a second voltage is generated in the unit, and the second voltage is compared to one or more reference voltages to generate an undervoltage or overvoltage indicator that indicates whether the current adjustable power supply voltage is too low or too high, wherein the bias voltage is connected to the third input voltage port.

Optionally, in the APD photoelectric receiver, the bias voltage generating unit may also comprise a bias setting signal port, and the bias setting signal is used to precisely set the level of the bias voltage independent from the photocurrent intensity feedback signal.

Optionally, the APD photoelectric receiver may also comprise: a bias voltage adjusting unit, which is used to generate a control signal based on the undervoltage or overvoltage indicator from the bias voltage generating unit; the control signal can be used to control the adjustable power supply so that it meets the minimum voltage requirement for the APD to operate normally, which in turn minimizes the output voltage of the power supply. At the same time, the control signal is also used to control and stabilize the bias voltage in the process of controlling the voltage of the APD's power supply.

Optionally, the APD photoelectric receiver may also comprise: an auxiliary power supply, which can provide the bias voltage needed by the APD for normal operation either independently or as an assistance to the adjustable power supply; a power supply switchover unit, which is used to connect the auxiliary power supply to supply power for the APD based on the undervoltage indicator from the bias voltage generating unit and to disconnect the auxiliary power supply when the adjustable power supply is out of the undervoltage state so that the adjustable power supply is the sole power supply for the APD.

Optionally, the APD photoelectric receiver may also comprise: a temperature compensation unit, which is used to increase or decrease the level of the bias voltage based on changes in temperature, and to provide temperature compensation to the APD's bias voltage so that the APD maintains the optimal bias voltage within its operating temperature range.

APD bias controllers and APD photoelectric receivers designed with the low-power APD bias control method of embodiments of the present disclosure may have the following advantages.

There may be no damage to the APD with strong optical input. The bias circuit may remain low in power consumption within its nominal optical input power range. The APD may have sufficient dynamic response capability to prevent link interruption caused by photocurrent underload or overload. The APD bias voltage can be precisely adjusted to obtain maximum signal-to-noise ratio and increase the sensitivity level. Temperature compensation can be achieved for the APD bias voltage.

DETAILED DESCRIPTION

Figure 1A:
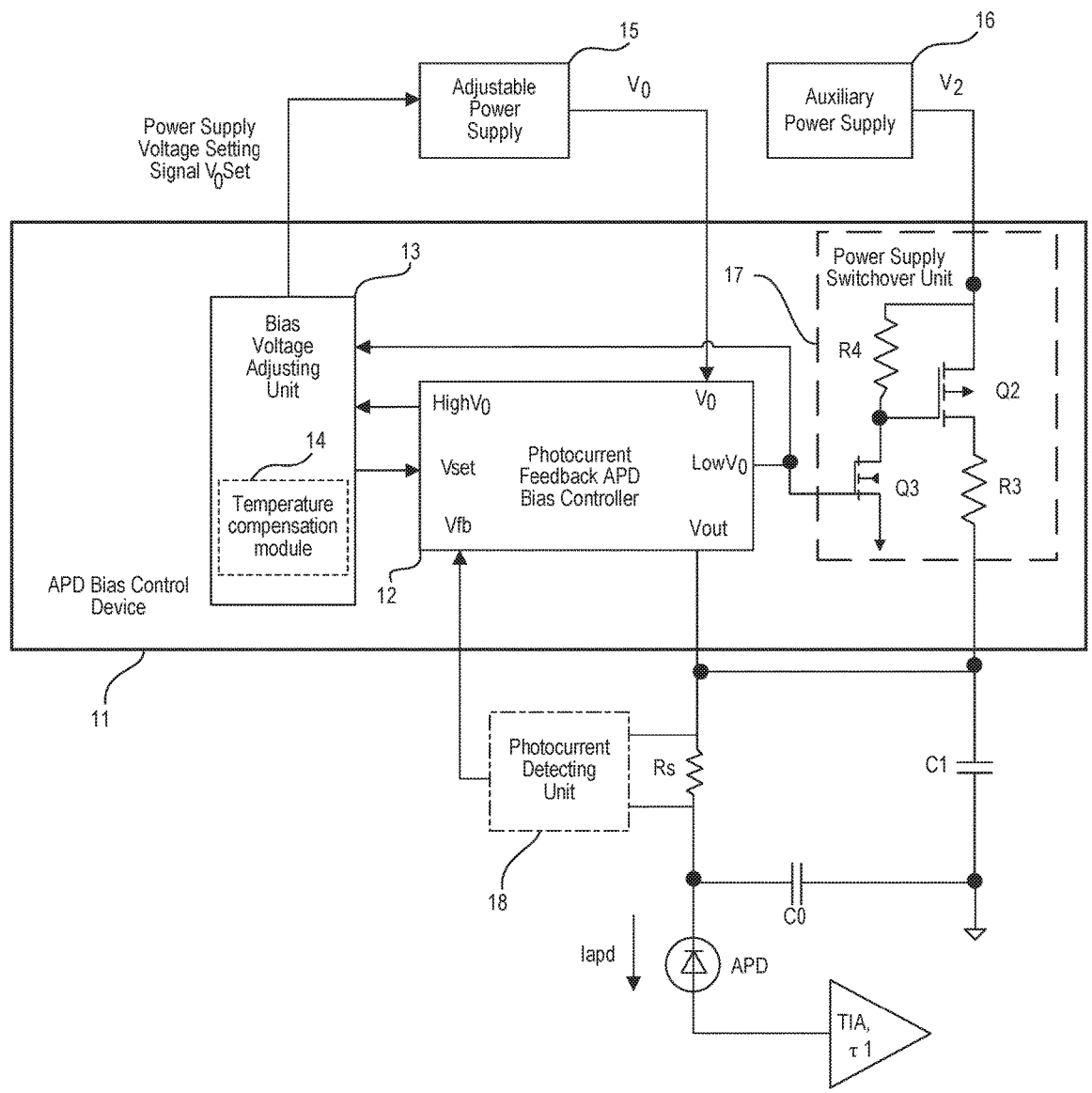
FIG. 1a shows a circuit block diagram for the low-power APD bias controller.

The text below provides detailed descriptions of embodiments of the disclosure as shown in the drawings. However, these embodiments do not limit the disclosure. The scope of the disclosure covers any changes made to the structure, method, or function by those of ordinary skill in the art based on the embodiments.

FIG. 1a shows a circuit block diagram for the low-power APD bias controller according to embodiments of the present disclosure. Below is a detailed description of the principles of the disclosure in reference to FIG. 1a. It should be noted that modules, units, parts, and any other element described in regard to embodiments of the present disclosure may be implemented by one or more of any sort of circuit, digital signal processor (DSP), application specific integrated circuit (ASIC), digital signal processing device (DSPD), programmable logic device (PLD), field programmable gate arrays (FPGA), controller, micro-controller, micro-processor, computer, or any other electronic component.

The overall circuit of the low-power APD bias controller of embodiments of the present disclosure may comprise an APD bias control device 11, an adjustable power supply 15, an auxiliary power supply 16, a photocurrent detecting unit 18, and peripheral circuitry, wherein the APD bias control device 11 can comprise a photocurrent feedback APD bias controller 12, a bias voltage adjusting unit 13, a temperature compensation module 14, and a power supply switchover unit 17.

Photocurrent feedback bias controller 12 has three input signals: 1) the adjustable power supply output voltage $V_0$, 2) the photocurrent intensity feedback signal $V_{fb}$, and 3) the bias setting signal $V_{set}$; and three output signals: 1) the undervoltage state indicator $LowV_0$, 2) the overvoltage state indicator $HighV_0$, and 3) the output voltage $V_{out}$.

Bias voltage adjusting unit 13 has two input signals: 1) the undervoltage state indicator $LowV_0$, and 2) the overvoltage state indicator $HighV_0$; and two output signals: 1) the bias setting signal $V_{set}$, which is an output to the photocurrent feedback APD bias controller, and 2) the adjustable power supply voltage setting signal $V_0$set, which can control the output voltage of the adjustable power source 15.

Power supply switchover unit 17 includes an N-channel MOS transistor Q3, a resistor R4, a P-channel MOS transistor Q2, and a resistor R3. Its input signal that controls the on/off switch is the undervoltage state indicator $LowV_0$ of the photocurrent feedback APD bias controller 12. The power supply switchover unit 17 is connected to the auxiliary power supply 16, and its output end is connected to the output end of output voltage $V_{out}$ of the photocurrent feedback APD bias controller 12, which are together connected to the peripheral circuit.

The peripheral circuit includes a precision sampling resistor Rs for optical input detection, a high-frequency filter capacitor C0, an optional filter capacitor C1, an avalanche photodiode (APD), and a trans-impedance amplifier (TIA).

Below is a detailed description of the operating principle of the low-power APD bias controller, with reference to FIG. 1a.

When the APD is reverse biased and the incident light reaches the photosensitive surface of the APD, the APD generates a photocurrent which flows through the sampling resistor Rs. The photocurrent detecting unit 18 detects the average photocurrent signal $I_{apd}$ on the sampling resistor Rs and generates a photocurrent intensity feedback signal $V_{fb}$, $$I_{apd}=Pin*\eta*M \quad (1)$$

where Pin is the optical input power (usually −30-+3 dBm), η is the responsiveness of the APD (usually 0.8-1 mA/mW), and M is the multiplication factor of the APD. The multiplication factor M of the APD is associated with the bias voltage of the APD $V_{apd}$ and can be approximated as:

$$M=1/[1-(V_{apd}/V_{br})^n] \quad (2)$$

where $V_{apd}$ is the reverse bias voltage of the APD, $V_{br}$ is the breakdown voltage at a given temperature and increases as the temperature increases, and n is between 1 and 3 and is determined by the semiconductor material, doping profile of the semiconductor, and wavelength of the radiation source. According to Formulas 1 and 2, the operating characteristic curve of the APD (i.e., the curve showing the relationship between the APD's photocurrent $I_{apd}$ and its reverse bias voltage $V_{apd}$ at a given optical input power) can be determined by:

$$I_{apd}=Pin*\eta/[1-(V_{apd}/V_{br})^n] \quad (3)$$

In order to obtain optimal sensitivity, $V_{apd}$ is usually set to be slightly below $V_{br}$ to make M fall between 10 and 20 when the optical input power is close to the sensitivity level. On the one hand, it is desirable that the APD voltage $V_{apd}$ is close to $V_{br}$ to the extent possible in order to increase M and photocurrent signal intensity. On the other hand, when M is too high, it will lead to excessive photocurrent noise, lowering the signal-to-noise ratio, which in turn lowers the sensitivity. In practice, optimal sensitivity is usually achieved when M is between 10 and 20.

A practical concern is damage caused by APD overload. For an optical module with an APD receiver, the optical output power at the emitting end is usually in the order of magnitude of several mW. When the emitting end is directly connected to the receiving end through a fiber optic patch cord or connector loopback, the optical receiving power of the APD suddenly increases from zero to several mW. In this event, if $V_{apd}$ and M cannot be lowered in a timely manner, a strong photocurrent will emerge within an instance, causing breakdown of and damage to the APD.

A basic function of the photocurrent feedback APD bias controller 12 is overload protection for the APD. Its output stage is serially connected between the output end of the adjustable power supply and the APD, and it generates a voltage drop $V_{drop}$ that changes with the photocurrent intensity. According to FIG. 1a, the bias voltage of the APD can be expressed as:

$$V_{apd}=V_0-V_s-V_{in}-V_{drop} \quad (4)$$

where $V_0$ is the output voltage of the adjustable power supply, $V_s=I_{apd}*Rs$ and is the voltage drop across the sampling resistor Rs, and Rs is the resistance of the sampling resistor Rs. $V_s$ can be neglected when a sampling resistor with a small resistance is selected. $V_{in}$ is the input voltage for the TIA, which is usually around 0.8V and does not change with the photocurrent. The photocurrent feedback APD bias controller 12 is designed to have the output voltage drop $V_{drop}$ increase as its photocurrent intensity feedback signal $V_{fb}$ increases, i.e.

$$V_{drop}=\text{func}(V_{fb}) \quad (5)$$

$$V_{fb}=I_{apd}*Rs*Gs, \quad (6)$$

where func(x) is a monotonically increasing function and Gs is the voltage gain of the photocurrent detecting unit. Usually Rs and Gs are selected so that Rs*Gs is 0.5-1 k ohm, and $V_{fb}$ is 0-2×$V_{ref}$, where the reference voltage $V_{ref}$ is +1.25V. According to Formulas 4-6, the load line of the APD can be determined, i.e., $$V_{apd}=V_0-V_s-V_{in}-\text{func}(I_{apd}*Rs*Gs) \quad (7)$$

Because func(x) is a monotonically increasing function, the greater the photocurrent $I_{apd}$ is, the smaller $V_{apd}$ is, and the smaller the multiplication factor of the APD is. With appropriate configuration of the circuit parameters and selection of func(x), protection of APD is realized as $V_{apd}$ decreases to several volts and M approaches 1 when the optical power is close to the overload point, i.e., when there is almost no avalanche effect in the APD.

To illustrate, several examples are provided below:

Embodiment 1

Let there be an APD, $V_{br}$=+40V, n=2. Further, let $V_{in}$=+0.8V; $V_s$ can be neglected; the gain of the sampling circuit (Rs*Gs) is 0.5 k ohm; and the APD responsiveness η=1 mA/mW. Set $V_0$=+40V, and select a linear function for func(x), i.e.

$$\text{func}(V_f)=32*V_{fb}+0.5=16e3*I_{apd}+0.5 \quad (8)$$

$$V_{apd}=40-0.8-V_{drop}=38.7-16\text{ k}*I_{apd} \quad (9)$$

Figure 1B:
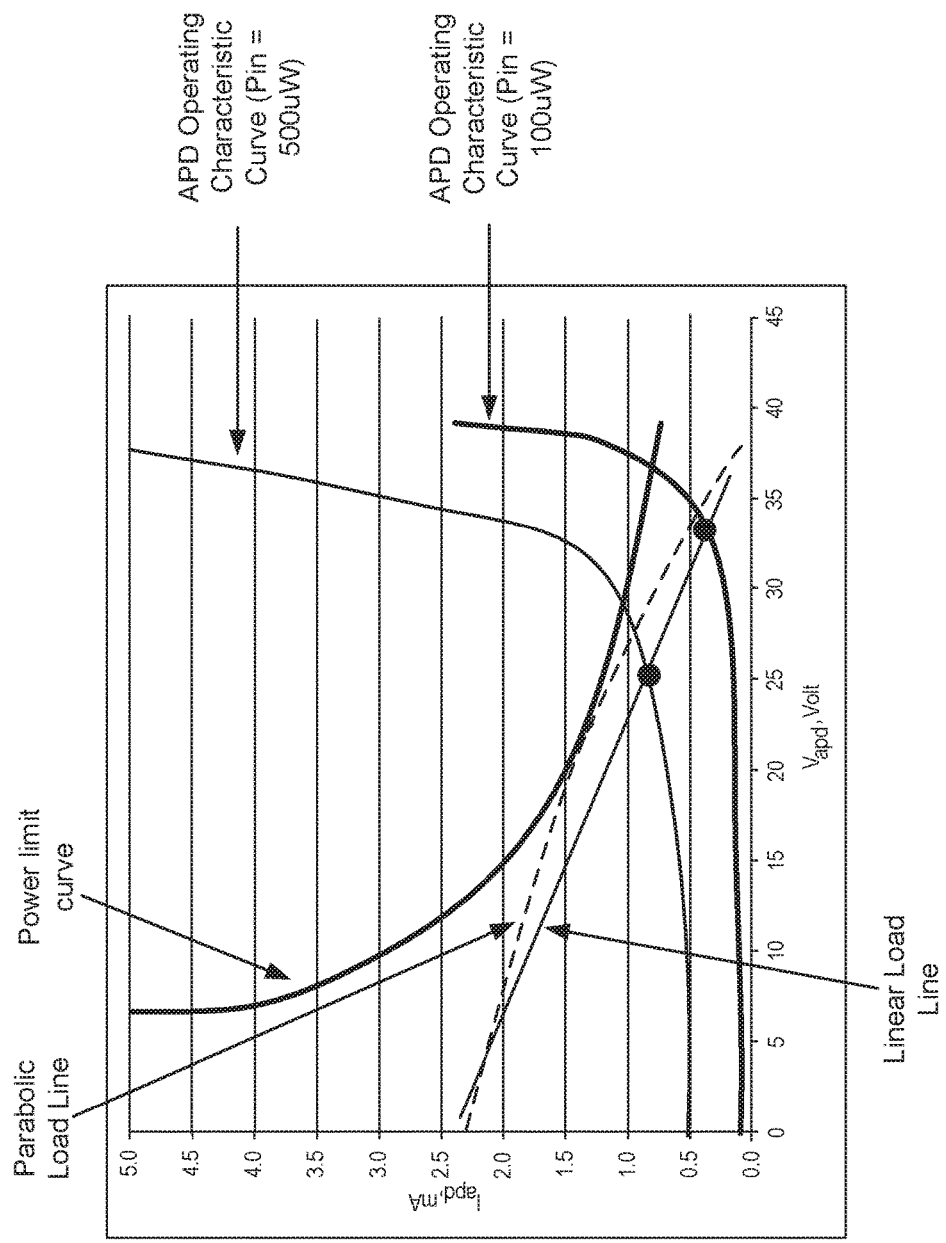
FIG. 1b shows an APD characteristic curve, load lines, and operating points.

As shown in FIG. 1b, we can draw the APD load line (a straight line in this case) in an I-V graph according to Formula 9; on the other hand, we can draw the APD operating characteristic curves at optical input powers of 100 uW and 500 uW, respectively, according to Formula 3. In the I-V graph, the voltage and photocurrent at the point of intersection between the APD operating characteristic curve and the load line are the APD's bias voltage and photocurrent at the corresponding input optical power.

Let the sensitivity level be Pin=3.8 uW, it can be determined that at this point $I_{apd}$=40 uA according to the I-V graph, $V_{drop}$=1.14V and $V_{apd}$=38.06V according to Formulas 8 and 9, and M=10.57 according to Formula 2.

When the increase in the optical input power Pin causes $I_{apd}$ to reach 2 mA, $V_{drop}$=32.5 according to Formula 8, $V_{apd}$=6.7 according to Formula 9, and M=1.03 according to Formula 2. According to Formula 1, at this time the optical input power Pin=$I_{apd}$/(η*M)=2/(1*1.029)=1.944 mW.

According to Formulas 6 and 7, when the APD remains under reverse bias voltage, maximum photocurrent is 38.7V/16 k=2.42 mA, and the corresponding optical power is approximately 2.42 mW (+3.8 dBm).

From Embodiment 1, we can see that when a linear function is selected for func(x), $V_{drop}$ and $I_{apd}$ have a directly proportional relationship, and with proper selection of its gain (e.g. 16 k ohm) the photocurrent does not exceed 2.42 ma when the optical input power is within its normal operating range (in this example <=+3 dBm). Further, the power consumption of the APD Papd=$I_{apd}*V_{apd}$, and according to Formula 9, $$Papd=I_{apd}*(38.7-16e3*I_{apd}) \quad (10)$$

It reaches its maximum value when $I_{apd}$=38.7/16e3*½=1.21 mA, and the maximum power consumption is 23.4 mW, which does not exceed the limit for APDs in general.

In practical applications, we may set a power consumption limit for the APD (e.g. 30 mW) based on the requirement of the application and draw it in the I-V graph. FIG. 1b shows the 30 mW power consumption limit curve. The selected APD load line should fall in the safe operating area to the lower left of the curve for the given power consumption limit, so that the APD's operating point does not exceed the given power consumption limit at any optical input power.

It should be noted that even though a linear function is selected for func(x) in the aforementioned Embodiment 1, func(x) can be a different monotonically increasing function based on the requirement of the actual application. For example, $V_{drop}$ can be a quadratic polynomial function of $V_{fb}$ (or $I_{apd}$), i.e., $$V_{drop}=V_{fb}^2*4+V_{fb}*7+1; \text{ or}$$

$$V_{drop}=I_{apd}^2*4e6+I_{apd}*7e3+1; \text{ thus}$$

$$V_{apd}=38.2-I_{apd}^2*4e6-I_{apd}*7e3 \quad (11)$$

which is a parabolic load line, as showing by the dash line in FIG. 1b. Comparing the two load lines, we can see:
(1) As func(x) is a monotonically increasing function, it can be ensured that there is a monotonically increasing relationship between photocurrent $I_{apd}$ and optical input power Pin, i.e., for each optical input signal there is a definite value for the photocurrent.
(2) A parabolic load line is more conducive to increasing the photocurrent at low optical input power near the sensitivity level.
(3) Both load lines fall within the safe operating area.
(4) In both cases the maximum operating current is limited to around 2.4 mA.

In embodiments where a microprocessor is used to sample $V_{fb}$ and control $V_{drop}$, the selection of func(x) can be more flexible to achieve a desired APD operating mode.

The method described above can realize overload protection for the APD. However, one issue remains; When the optical input power is close to the overload point, $V_{apd}$ is very small and $V_{drop}$ is very large, and the majority of the output power from the adjustable power supply is wasted on $V_{drop}$. Assuming the output current from the adjustable power supply mainly supplies the APD, output power P0 from the power supply is;

$$P0 = I_{apd} * V_0$$
$$= I_{apd} * (V_{apd} + V_{drop} + V_s + V_{in}) \text{ (according to Formula 4)}$$
$$= I_{apd} * (V_{apd} + V_s + V_{in}) + I_{apd} * V_{drop}$$
$$= P1 + P2$$

$$P1 = I_{apd} * (V_{apd} + V_s + V_{in})$$
$$P2 = I_{apd} * V_{drop}$$

where P1 is the power required for the APD to operate and P2 is wasted power. As in the same example given before, when the optical input power Pin=1.94 mW and $I_{apd}$=2 mA, $V_0$=40V, $V_{drop}$=32.5V, P2=65 mW, P0=40*2 mA=80 mW, P1=15 mW. We can see that the majority of the power from the power supply is wasted on $V_{drop}$; 65 mW is wasted for each channel. If $V_0$ and $V_{drop}$ both decrease by 32V to 8V and 0.5V, respectively, APD remains in the same operating state (same $V_{apd}$ and $I_{apd}$) but waste power P2 can be decreased to 0.5V*2 mA=1 mW. For a four-channel optical module with a total power of 3.5 W, the amount of energy saved is (65−1)*4=256 mW, or 7.3%, which is significant.

In order to decrease P2, $V_{drop}$ must be decreased, Embodiments of the present disclosure may provide a $V_{drop}$ feedback control loop to keep $V_{drop}$ within a predetermined target range, so that the power of the adjustable power supply is minimized under the precondition that the APD operates normally.

The target value $V_{drop}0$ for $V_{drop}$ is usually determined based on the limit that can be reached by the control circuit (e.g., the minimum voltage drop for the emitter follower) in order to minimize power wasted.

The mechanism of the $V_{drop}$ control loop is: Based on the difference between current $V_{drop}$ and its target value $V_{drop}0$, a control value is obtained from a predetermined control logic; at the same time, the voltage $V_0$ of the adjustable power supply and $V_{drop}$ are increased or decreased to maintain $V_0-V_{apd}$ stable; thus, according to Formula 4, $V_{apd}$ remains unchanged.

As shown in FIG. 1a, the adjustable power supply 15 is usually a DC/DC step-up circuit, whose output voltage $V_0$ is determined by the control voltage $V_0$set, i.e., $$V_0 = V_0\text{set}*A \quad (12)$$

where A is the fixed gain of the step-up circuit.

In order to control $V_{drop}$, a bias setting signal $V_{set}$ may be introduced. The $V_{set}$ signal influences $V_{drop}$ independent from the photocurrent intensity feedback signal $V_{fb}$, i.e., $$V_{drop} = \text{func}(V_{fb}) + B*(V_{set} - V_{ref}) \quad (13)$$

where $V_{ref}$ is the reference signal and B is the gain from $V_{set}$ to $V_{drop}$.

In applications where the power consumption does not need to be optimized for the power supply, $V_{set}$ can be fixed at $V_{ref}$. However, in a low-power APD bias controller, $V_{set}$ can be adjusted relative to $V_{ref}$ in order to increase or decrease $V_{drop}$. The range of change for $V_{set}$ is set at $0-2 \times V_{ref}$, and a gain B is chosen so that $B*V_{ref}$ is no smaller than the maximum value of func($V_{fb}$), i.e., $$B >= \max(\text{func}(V_{fb}))/V_{ref} \quad (14)$$

Thus $V_{drop}$ can be decreased to 0 or below through $V_{set}$ under any $V_{fb}$.

Figure 1C:
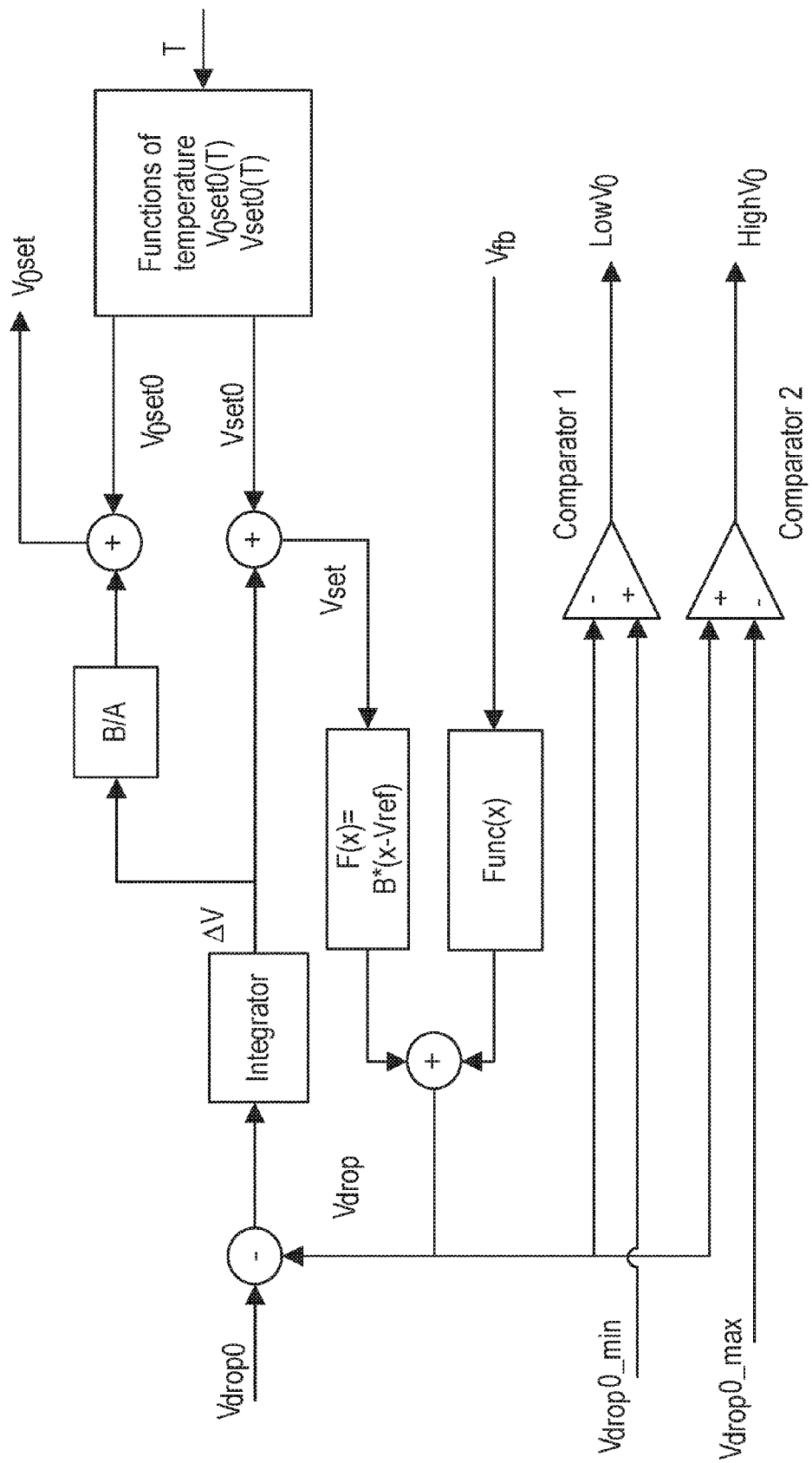
FIG. 1c shows a logic block diagram for the low-power APD bias controller.

FIG. 1c shows a logic block diagram for the $V_{drop}$ control loop, which has the following operating principles:

1) Acquire $V_{fb}$, and calculate $V_{drop}$ according to Formula 13; or acquire $V_{drop}$ directly.
2) Calculate the error by deducting the current $V_{drop}$ from the target voltage drop $V_{drop}0$.
3) Generate the control signal $\Delta V$ from the integrator by integrating the error.
4) Generate $V_{set}$ and $V_0$set by superposing the control signal $\Delta V$ to the initial value of $V_{set}$, $V_{set}0$, and to the initial value of $V_0$set, $V_0$set0, in respective corresponding proportions, i.e., $$V_{set} = V_{set}0 + \Delta V, \quad (15)$$

$$V_0\text{set} = V_0\text{set}0 + \Delta V*B/A \quad (16)$$

Based on the logic above and according to Formulas 12 and 13, $$V_{drop} = \text{func}(V_{fb}) + B*(V_{set}0 + \Delta V - V_{ref}) \quad (17)$$

$$V_0 = V_0\text{set}*A + \Delta V*B \quad (18)$$

$$V_0 - V_{drop} = V_0\text{set}0*A - B*(V_{set}0 - V_{ref}) - \text{func}(V_{fb}) \quad (19)$$

No association exists between $V_0-V_{drop}$ and $\Delta V$.

As the purpose of the $V_{drop}$ control loop is to reduce the power consumed when the module is operating in a steady state, an appropriate integral time constant can be selected for the integrator so that the closed loop response time constant of the control loop is relatively large, e.g., 0.1 second-several seconds.

In one embodiment, an interval for the voltage drop $V_{drop}$, i.e., [$V_{drop}0\_\min$, $V_{drop}0\_\max$], can be set around the target value $V_{drop}0$ and the range can be used to determine if the adjustable power supply is in an overvoltage state (expressed as logic high for the logic signal HighV$_0$) or undervoltage state (expressed as logic high for the logic signal LowV$_0$). For example, $V_{drop}0\_\min$ can be set to be between the minimum voltage drop $V_{drop}\_\text{extreme}$ that can be achieved by the control circuit and $V_{drop}0$, and set $V_{drop}\_\max$ to be slightly higher than $V_{drop}0$, i.e., $$V_{drop}\_\text{extreme} <= V_{drop}\_\min <= V_{drop}0 \quad (20)$$

$$V_{drop}\_\max >= V_{drop}0 \quad (21)$$

As shown in FIG. 1c, when the optical power and photocurrent intensity feedback signal $V_{fb}$ increase, $V_{drop}$ can be higher than $V_{drop}0\_\max$, and Comparator 1 generates an output of logic high for the logic signal HighV$_0$, indicating that the adjustable power supply is in an overvoltage state at this time; power consumption can be reduced by decreasing $V_0$ and $V_{drop}$. Conversely, when the optical power and $V_{fb}$ decrease, $V_{drop}$ can be lower than $V_{drop}0\_\min$, and Comparator 2 generates an output of logic high for the logic signal LowV$_0$, indicating that the adjustable power supply is in an undervoltage state, where the power supply voltage cannot meet the voltage needed for the normal APD bias voltage at the current optical input power and $V_0$ and $V_{drop}$ need to be increased to prevent the circuit going into the cut-off mode.

When the photocurrent intensity voltage $V_{fb}$ continues to decreasing, such that the $V_{drop}$ computed based on Formula 12 is lower than $V_{drop}0\_\text{extreme}$, the control circuit enters the cut-off mode. In the cut-off mode, due to the physical limitation of the control circuit, the actual voltage drop no longer changes with the $V_{set}$. Instead, the actual voltage drop stays at $V_{drop}0\_\text{extreme}$, and the APD bias voltage $V_{apd}$ only changes with the $V_0$. Meanwhile, the integrator in $V_{drop}$ control loop gradually increases the $\Delta V$. On one hand, the increase of the $\Delta V$ causes the $V_0$set and $V_0$, and thus the $V_{apd}$, to increase. On the other hand, the increase of the $\Delta V$ causes the $V_{set}$ to increase, and therefore the control circuit can gradually leave from the cut-off mode and the voltage drop $V_{drop}$ can re-enter the predetermined target range.

Now an example is provided to illustrate the embodiment described above.

Embodiment 2

Using the same APD characteristic parameters and circuit parameters in Embodiment 1, and let the sensitivity target be 3.8 uW and func(x) be a linear increasing function determined by Formula 5, i.e., func($V_{fb}$)=16 k*$I_{apd}$+0.5, and let B=32, $V_{set}0=V_{ref}$+1.25V, A=32, $V_0$set0=$V_0$/A=1.25V. Further, let $V_{drop}0=0.82V$, $V_{drop\_min}=V_{drop\_extreme}=0.5V$, $V_{drop\_max}=1.14V$. Below is a description of the operating mode of the $V_{drop}$ control loop when the optical input power increases from the sensitivity point of 3.8 uW (corresponding $I_{apd}=40$ uA) to +1.94 mW (corresponding $I_{apd}=2$ mA).

According to calculations in Embodiment 1, when the optical input power is 3.8 uW and $V_{drop}$ is not controlled, according to the load line and characteristic curve shown in FIG. 1b, $I_{apd}=40$ uA, $V_{apd}=38.06V$, $V_{drop}=1.14V$. After the $V_{drop}$ control loop is enabled, because $V_{drop}$ is greater than its target value 0.82V, the error integrator will increase $\Delta V$ gradually in the negative direction until $\Delta V=(0.82-1.14)/B=-0.32/32=-0.01V$, thus $V_{set}=1.25+(-0.01)=1.24V$ (according to Formula 15)

$V_0set=1.25+(-0.01)*32/32=1.24V$ (according to Formula 16)

$V_{drop}=16 \text{ k}*40 \text{ uA}+0.5+32*(1.25-0.01-1.25)=0.82V$ (according to Formula 17)

$V_0=1.25*32+32*(-0.01)=39.68V$ (according to Formula 18)

$V_0-V_{drop}=38.06$.

When the optical power rapidly increases to +1.944 mW, $I_{apd}$, $V_{fb}$, and $V_{drop}$ will all rapidly increase before the control loop can play a significant role, until $I_{apd}$ reaches 2 mA. At this time, $V_{drop}=16 \text{ k}*2 \text{ mA}+0.5+32*(1.24-1.25)=32.18V$ (Formula 17)

$V_0-V_{drop}=39.68-32.18=7.5V$;

$V_{apd}=7.5-0.8=6.7V$, which falls on the APD characteristic curve as shown in Formula 9. Then the $V_{drop}$ control loop begins to operate and the integrator continues to increase $\Delta V$ in the negative direction until $\Delta V=-0.01+(0.82-32.18)/32=-0.99V$, thus $V_{set}=1.25-0.99=0.26V$.

$V_0set=1.25+(-0.99)*32/32=0.26V$ $V_{drop}=16 \text{ k}*2 \text{ mA}+0.5+32*(0.26-1.25)=0.82V$, which reaches the target value;

$V_0=1.25*32+32*(-0.99)=8.32V$.

$V_0-V_{drop}=7.5V$, which remains the same.

It should be noted that the characteristics of the APD component changes with the operating temperature T. When the temperature increases, $V_{br}$ increases as well. If at this time the bias voltage $V_{apd}$ remains the same, M will decrease; to make sure the value of M remains the same, the APD bias voltage should be increased accordingly as the temperature increases. When the temperature decreases, $V_{br}$ decreases as well. If at this time the bias voltage $V_{apd}$ remains the same, M will increase; to make sure the value of M remains the same, the APD bias voltage should be decreased accordingly as the temperature decreases. Therefore, the APD bias controller generally has a temperature compensation function.

Referencing to FIG. 1c, an embodiment of the APD bias controller with temperature compensation function is described. This is realized through determining in advance the set initial value $V_0set0$ of the adjustable power supply voltage as a function of the temperature and the set initial value $V_{set}0$ of the voltage as a function of the temperature, i.e. $V_0set0(T)$ and $V_{set}0(T)$.

Under a given temperature T0, $V_0set0$ and $V_{set}0$ can be calibrated with the following method:
1) Fix the optical input power Pin of the APD receiver to a value that is close to its sensitivity target,
2) Set $V_{set}=V_{ref}$, gradually increase $V_0set$ and at the same time monitor the output bit error rate of the APD receiver. Record the value of $V_0set$ at the point where the lowest bit error rate is achieved as $V_0set\_opt$.
3) Acquire $V_{fb}$ at the optimal sensitivity point and record it as $V_{fb}\_opt$. Then calculate the value of $V_{drop}$ at this point according to Formula 13, recorded as $V_{drop}\_opt=func(V_{fb}\_opt)$.
4) Compare $V_{drop}\_opt$ and $V_{drop}0$ for the purpose of adjusting $V_0set0$ and $V_{set}0$, i.e., $V_0set0(T0)=V_0set\_opt+[V_{drop}0-V_{drop}\_opt]/A$, $V_{set}0(T0)=V_{ref}+[V_{drop}0-V_{drop}opt]/B$.

$V_0set0$ and $V_{set}0$ obtained from the calibration above can ensure that the sensitivity of the APD at temperature T0 is optimal and the initial $V_{drop}$ equals its target value.

In general, a number of temperature points within the APD operating temperature range (generally including at least the lowest temperature Tmin, the highest operating temperature Tmax, and a typical middle temperature T0) are selected and calibrated with the procedure described above to obtain the corresponding $V_0set0$ and $V_{set}0$ at each temperature point. Then with piecewise linear interpolation or polynomial fitting, a curve showing the relationship between $V_0set0$ and the temperature T and a curve showing the relationship between $V_{set}0$ and the temperature T can be determined. Based on these curves, parameters can be set for the initial values of the temperature compensation circuit; or, the curves can be saved into the memory of a microprocessor for use in the temperature compensation algorithm.

As shown in FIG. 1c, the mechanism for $V_{drop}$ control with temperature compensation is built on top of the mechanism for $V_{drop}$ control without temperature compensation as described above, with the addition of temperature acquisition as well as the determination of $V_0set0$ and $V_{set}0$ under the current temperature based on preset functions $V_0set0(T)$ and $V_{set}0(T)$. Below is a summary of the mechanism:
1) Acquire the current APD operating temperature T;
2) Obtain $V_0set0$ and $V_{set}0$ based on preset functions $V_0set(T)$ and $V_{set}0(T)$;
3) Acquire $V_{fb}$, and calculate $V_{drop}$ according to Formula 13; or acquire $V_{drop}$ directly;
4) Calculate the error by deducting the current $V_{drop}$ from the target voltage drop $V_{drop}0$.
5) Generate the control signal $\Delta V$ from the integrator by integrating the error.
6) Generate $V_{set}$ and $V_0set$ by superposing the control signal $\Delta V$ to the initial value $V_{set}0$ of $V_{set}$ and initial value $V_0set0$ of $V_0set$ in respective corresponding proportions.

It should also be noted that the response speed of $V_{drop}$ to the photocurrent $I_{apd}$ and photocurrent intensity signal $V_{fb}$ should be set in the microsecond order of magnitude in order to achieve APD overload protection. However, the purpose of the $V_{drop}$ control loop is to reduce power consumption, plus the response speed of the DC/DC step-up circuit is limited in general (usually in the millisecond order of magnitude), thus the response speed T1 of the $V_{drop}$ control loop to $V_{fb}$ is generally set at the hundred millisecond order of magnitude or slower. When the adjustable power supply is in an undervoltage state, within the time τ1, the APD bias voltage $V_{apd}$ is lower than the expected operating point, which may cause the signal-to-noise ratio to decrease, reducing the performance of high-speed signal transmission. Under normal conditions, if undervoltage occurs in testing or when the optical fiber link suffers an abnormal impact, the link experiences temporary degradation and recovers, which can still meet the requirement of actual applications. If it is required that the link maintains high performance within the time τ1, a more rapid dynamic response from $V_{apd}$ will be required.

In order to improve the high-speed transmission performance within the time τ1, embodiments of the present disclosure may also provide high-speed dynamic response. As shown in FIG. 1a, this is accomplished by the auxiliary power supply 16 and the power supply switchover unit 17. The auxiliary power supply circuit is configured as follows: a) When the adjustable power supply is in an undervoltage state, the auxiliary power supply can provide the bias voltage needed by the APD for normal operation either independently or as an assistance to the adjustable power supply; b) When the adjustable power supply is out of the undervoltage state, the power supply circuit that the auxiliary power supply powers the APD is disconnected, but the auxiliary power supply maintains its output voltage in a standby state, and its power consumption is low because there is no load current.

In one embodiment, the output voltage V2 of the auxiliary power supply 16 can be set based on the output voltage of the adjustable power supply and the setting of the initial value of the voltage in the current temperature, and the output voltage V2 changes as the temperature changes, i.e., $$V2(T) = V_0 set0(T)*A - B*(V_{set}0(T) - V_{ref}) - C \tag{22a}$$

$$\text{or } V2(T) = V_0 set\_opt(T) - C \tag{22b}$$

where A is the gain of the adjustable power supply, B is the gain from $V_{set}$ to $V_{drop}$, C is a constant, $V_{ref}$ is the reference voltage, T is the APD's operating temperature, and $V_0 set\_opt$ is the value set for $V_0$ corresponding to the optimal sensitivity point when $V_{set}0 = V_{ref}$ according to the calibration steps described before. V2 is set to change only with a change in temperature T and not influenced by $V_{fb}$ or $V_{set}$. The operating principle is described below.

To support the normal operation of the auxiliary power supply and on/off switch, the output stage of the photocurrent feedback APD bias controller 12 can be configured as a emitter follower bipolar junction transistor (BJT; with the collector terminal connected to $V_0$, the emitter terminal connected to the load, and the base terminal connected to the control voltage). In this way, the output end of the photocurrent feedback APD bias controller 12 is connected directly to the output end of the power supply switchover unit 17, forming a dual-source power supply circuit that provides bias voltage to the APD. Based on the value of $V_{drop}$, the dual-source power supply circuit has the following operating states:

State 1: $V_{drop} \geq V_{drop}0\_min$. Now $LowV_0$ is invalid, and the auxiliary power supply is off. The emitter follower BJT is turned on, and the APD's bias voltage is solely determined by the bias controller 12, i.e., $$V_{apd}1 = (V_0 - V2 - V_{in}) - V_{drop} \tag{23}$$

State 2: $V_{drop} < V_{drop}0\_min$. Now $LowV_0$ is valid, the N-channel MOS transistor Q3 and P-channel MOS transistor Q2 are turned on, the auxiliary power supply is connected, and the auxiliary power supply provides the bias voltage and operating current to the APD through the serially connected resistor R3. The load line function of the auxiliary power supply V2 and R3 is defined as follows:

$$V_{apd}2 = (V2 - V_s - V_{in}) - I_{apd}*R3 \tag{24}$$

Thus, based on the value of photocurrent $I_{apd}$, there are two substates for State 2:

State 2.1: $V_{apd}2 < V_{apd}1$. Now the emitter follower BJT is turned on, the APD bias voltage $V_{apd} = V_{apd}1$, but the operating current of the APD is provided by both power supplies simultaneously.

State 2.2: $V_{apd}2 \geq V_{apd}1$. Now the emitter follower BJT is turned off, the APD bias voltage $V_{apd} = V_{apd}2$, and the operating current is provided solely by the auxiliary power supply.

When switching over between State 1 and State 2, if $V_{apd}1$ and $V_{apd}2$ are not the same, the APD bias voltage may experience a transient change. To avoid any disruption of high-frequency transmission performance caused by instantaneous jump, on the one hand, a capacitor C1 can be configured as shown in FIG. 1a, which is connected between the dual-source power supply output end and the signal ground, and the values of C1, R3, and Rs can be set in a reasonable way to set the switchover time at the required value, e.g., the 100 us order of magnitude. On the other hand, the output voltage of the auxiliary power source can be reasonably set so that $V_{apd}1$ equals $V_{apd}2$ when the switchover between State 1 and State 2 takes place (i.e., when $V_{drop} = V_{drop}0\_min$). According to Formulas 17, 19, 23, and 24, $V2 - I_{apd}*R3 = V_0 - V_{drop} = V_0 set0*A - B*(V_{set}0 - V_{ref}) - func(V_{fb})$, or $$V2 = V_0 set0*A - B*(V_{set}0 - V_{ref}) - (func(V_{fb}) - I_{apd}*R3) \tag{25}$$

According to Formula 25, if R3 is reasonably configured so that $func(V_{fb}) - I_{apd}*R3$ remains largely unchanged or a constant C in the operating range of the photocurrent, then Formula 25 has the same form of Formula 22a, and the auxiliary power supply voltage can be set based on the initial value $V_0 set0$ of the adjustable power supply output voltage and the set initial value $V_{set}0$ of the voltage, in order to stabilize the APD voltage when the auxiliary power supply switchover occurs.

An example is provided below to illustrate the power supply switchover process.

Embodiment 3

Let the APD characteristic parameters, circuit parameters, and $V_{drop}$ function be the same as in Embodiment 2. Set R3=16 k ohm, according to the calibration steps described before and Formulas 22 and 25, $V_0 set\_opt = 1.25V$, C=0.5V, V2=40−0.5=39.5V. Further, let the stabilization time of the $V_{drop}$ control loop be approximately 500 ms, the current optical input power Pin=1.95 mW, $I_{apd}$ stabilized at 2 mA, $V_{drop}$ control loop stabilized, $V_{drop} = 0.82V$, $V_0 = 8.32V$. The table below describes the process of change in the circuit's operating state when the optical power decreases to the sensitivity point Pin=3.8 uW within 10 us.

TABLE 1

| Time | Optical power | State of APD | State of load circuit | State of dual-source power supply | State of control loop |
|---|---|---|---|---|---|
| 0 | 1.95 mW | $I_{apd}$ = 2 mA, $V_{apd}$ = 6.8 V, M = 1.029 | $V_0$ = 8.32 V, $V_{drop}$ = 0.82 V | State 1, V2 = 39.5 V, $V_{apd}1$ = 7.82 V | $LowV_0$ = 0, ΔV = −0.99, $V_{set}$ = 0.26, |

TABLE 1-continued

| Time | Optical power | State of APD | State of load circuit | State of dual-source power supply | State of control loop |
|---|---|---|---|---|---|
| Continues | 1.918 mW | $I_{apd}$ = 1.98 mA, $V_{apd}$ = 7.02 V, M = 1.032 | $V_0$ remains the same $V_{drop}$ = 0.5 V | Seamless switchover into State 2.2, $V_{apd}1$ = 7.82, $V_{apd}2$ = 7.82, | Low$V_0$ = 1, $\Delta V$, $V_{set}$ slightly increase |
| Continues | Continues to decrease | $I_{apd}$ decreases, $V_{apd}$ and M increase | $V_{drop}$ stops at 0.5 V | Remains in State 2.2, $V_{apd}2$ increases | Same as above |
| 10 us | 3.8 uW | $I_{apd}$ = 40 uA, $V_{apd}$ = 38.06, M = 10.57, | Same as above | Remains in State 2.2, $V_{apd}1$ = 7.82, $V_{apd}2$ = 38.86 | Same as above |
| Continues | Remains the same | Remains the same | $V_0$ continues to increase, $V_{drop}$ = 0.5 | Remains in State 2.2, $V_{apd}1$ continues to increase, $V_{apd}2$ remains the same | $\Delta V$, $V_{set}$ continue to increase |
| Approaches 500 ms | Remains the same | Remains the same | $V_0$ = 39.36, $V_{drop}$ = 0.5 | Seamless switchover into State 1, $V_{apd}1$ = 38.86 | Low$V_0$ = 0, $\Delta V$ = −0.02, $V_{set}$ = 1.23 |
| 500 ms | Remains the same | Remains the same | $V_0$ = 39.68, $V_{drop}$ = 0.82 | Remains the same | $\Delta V$ = −0.01, $V_{set}$ = 1.24 |
| Continues | Remains the same | Stabilized and same as above | Stabilized and same as above | Stabilized and same as above | Stabilized and same as above |

With the APD bias control method provided by embodiments of the present disclosure, hardware circuits or software algorithms or a combination of both can be conveniently employed in the design of the APD bias controller and bias voltage adjusting device.

Figure 2:
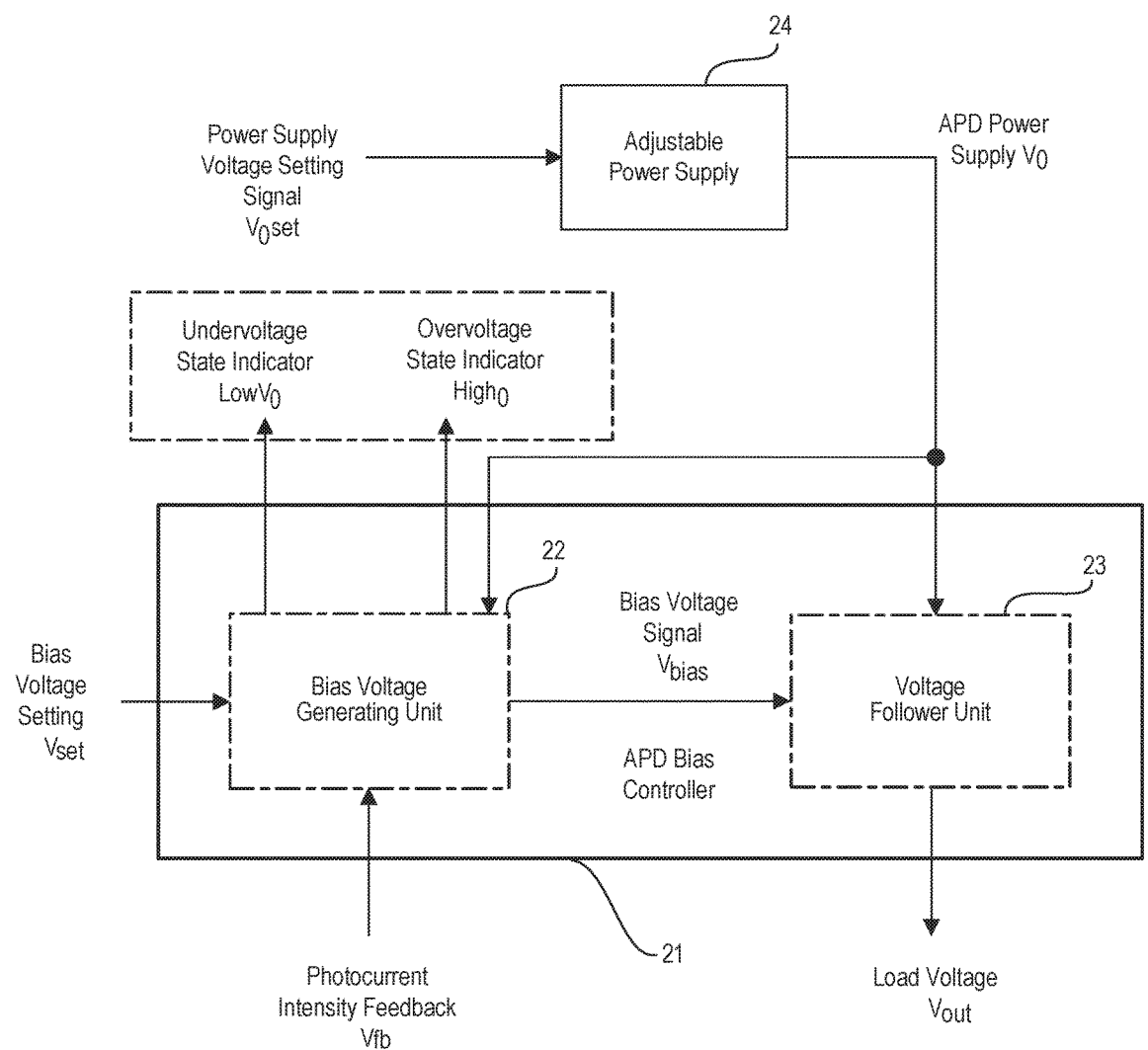
FIG. 2 shows a structural block diagram for the low-power APD bias controller.

FIG. 2 shows a structural block diagram for the low-power APD bias controller.

Low-power APD bias controller 21 includes a bias voltage generating unit 22, which uses an external photocurrent intensity feedback signal $V_{fb}$ to generate a bias voltage $V_{bias}$ that determines the output voltage drop, i.e., the voltage drop $V_{drop}$ between the voltage $V_0$ of the adjustable power supply and the output voltage $V_{out}$ ($V_{drop}$=$V_0$−$V_{out}$), which in turn determines the APD bias voltage $V_{apd}$. In addition, a second voltage ($V_{2nd}$ in FIG. 3a) that corresponds to the voltage drop signal $V_{drop}$ is generated within the unit, and the second voltage is compared to one or more reference voltages (e.g., $V_{ref}$, $V_{ref}2$ in FIG. 3a) to determine whether the voltage drop is within the target interval $V_{drop\_min}$–$V_{drop\_max}$, based on which an undervoltage or overvoltage indicator (i.e., Low$V_0$, High$V_0$ in FIG. 3a) is generated to indicate whether the current voltage $V_0$ of the adjustable power supply is too low or too high.

Bias voltage generating unit 22 has three input signals: the photocurrent intensity feedback signal $V_{fb}$, the bias setting signal $V_{set}$, and the adjustable power supply voltage $V_0$; and three output signals: the bias voltage $V_{bias}$, the undervoltage state indicator Low$V_0$, and the overvoltage state indicator High$V_0$. At the same time, input information $V_{fb}$ and $V_{set}$ are used to determine whether there is undervoltage or overvoltage, and corresponding output is generated, i.e., the undervoltage state indicator Low$V_0$ and overvoltage state indicator High$V_0$; and $V_0$ serves as an input for the bias voltage generating unit 22 to generate the bias voltage $V_{bias}$, which is an input for a voltage follower unit 23 that determines the level of the load voltage $V_{out}$ based on this signal. The voltage follower unit 23 also receives input from the adjustable power supply $V_0$, which supplies the operating power for the unit. In addition, the bias setting $V_{set}$ may be preferable in embodiments of the present disclosure, and the bias setting signal is used to set the levels of the bias voltage $V_{bias}$ and voltage drop signal $V_{drop}$, independent from the photocurrent intensity feedback signal. The purpose of the bias setting signal is, on the one hand, achieving precise setting of each APD bias voltage for optimum sensitivity, and on the other hand achieving low power consumption through adjusting the APD power supply voltage and voltage drop $V_{drop}$. In applications where low-power adjustment and precise setting of the voltage drop are not required, the bias setting signal may not be needed.

Low-power APD bias controller 21 also includes a voltage follower unit 23, which is used to make the load voltage change as the input voltage changes. It comprises a first port that can be connected to the adjustable power supply $V_0$, a second port that is used to provide the output voltage $V_{out}$ to the APD load circuit, and a third bias voltage $V_{bias}$ input port. The purpose of the voltage follower unit 23 is to make the output voltage $V_{out}$ change as the input voltage changes, i.e., $V_{out}$=$V_{bias}$−$V_{err}$, where $V_{err}$ is the fixed tracking error. For example, in the case where a PNP BJT is used for the output stage, $V_{err}$ is the voltage drop $V_{be}$ between the base terminal b and the emitter terminal e, usually 0.5V.

Figure 3A:
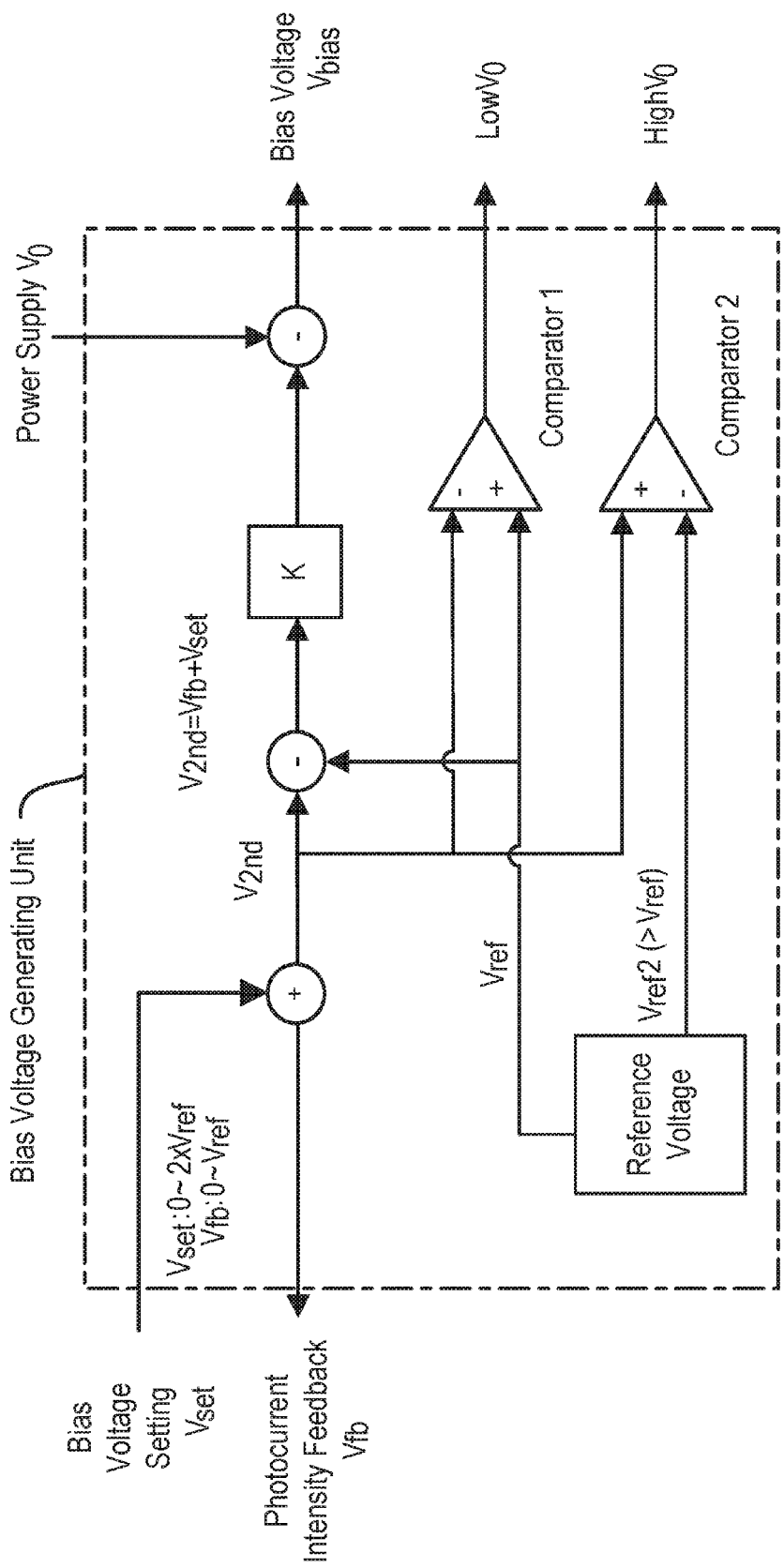
FIG. 3a shows a realization block diagram for the bias voltage generating unit with bias voltage setting.

FIG. 3a shows a realization block diagram for the bias voltage generating unit with bias setting signal. The generation of the bias voltage as well as the generation of the undervoltage and overvoltage indicator signals are described in detail below. The two input signals in the figure are the bias set value $V_{set}$ and the photocurrent intensity feedback signal $V_{fb}$, respectively, wherein the voltage of the second voltage $V_{2nd}$ in the figure is:

$$V_{2nd}=V_{fb}+V_{set}$$

Thus:

$$V_{bias} = V_0 - (V_{2nd} - V_{ref}) \times K = V_0 - (V_{fb} + V_{set} - V_{ref}) \times K$$

$$V_{out} = V_0 - (K * V_{fb} + K * (V_{set} - V_{ref}) + V_{err})$$

$$V_{drop} = V_0 - V_{out} = K * V_{fb} + V_{err} + K * (V_{set} - V_{ref}) = K * (V_{2nd} - V_{ref}) + V_{err}$$

Compared to Formulas 8 and 13, the function $V_{drop}$ has the same form.

The undervoltage state indicator $LowV_0$ is obtained by comparing the second voltage $V_{2nd}$ with the reference voltage $V_{ref}$ through Comparator 1. A low-threshold reference voltage $V_{ref}$ is set; if the value of the second voltage $V_{2nd}$ is lower than $V_{ref}$, the undervoltage state indicator signal $LowV_0$ is generated as an output. Now the difference between $V_{drop}$ and its lower target limit $V_{drop\_min}=V_{err}$.

The overvoltage state indicator $HighV_0$ is obtained by comparing the second voltage $V_{2nd}$ with the reference voltage $V_{ref2}$ through Comparator 2. A high-threshold reference voltage $V_{ref2}$ is set, $V_{ref2}>V_{ref}$; if the value of the second voltage $V_{2nd}$ is higher than $V_{ref}$, the overvoltage state indicator signal $HighV_0$ is generated as an output. Now the difference between $V_{drop}$ and its upper target limit $V_{drop\_max}=K*(V_{ref2}-V_{ref})+V_{err}$.

Figure 3B:
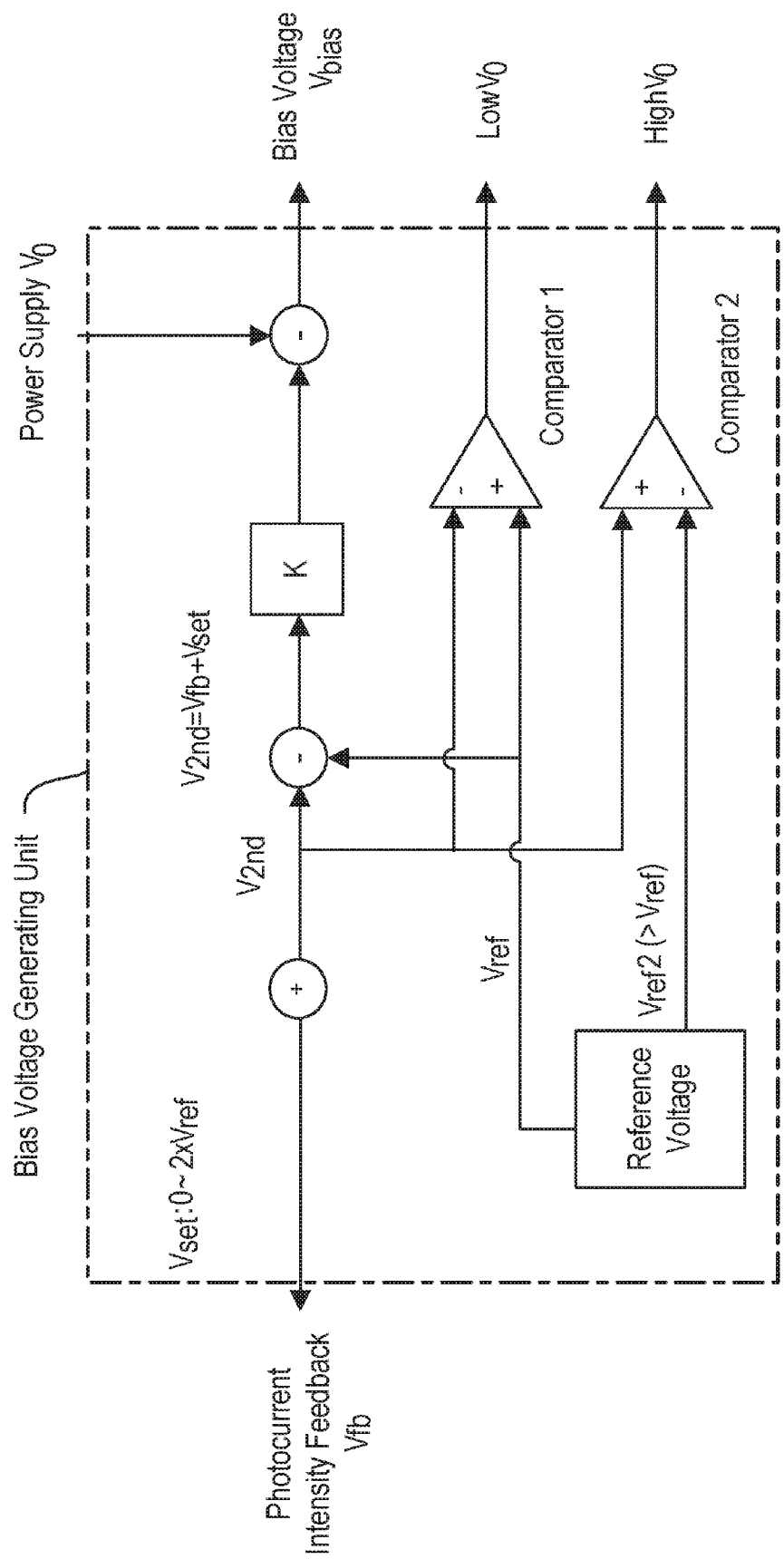
FIG. 3b shows a realization block diagram of the bias voltage generating unit without bias voltage setting.

Optionally, the bias voltage can be set through the photocurrent intensity feedback $V_{fb}$ only, without the input of a separate bias setting signal $V_{set}$, as shown in FIG. 3b.

FIG. 3b shows a realization block diagram of the bias voltage generating unit without bias voltage setting. This figure is similar to FIG. 3a except that the $V_{set}$ signal in FIG. 3a is fixed at V. In FIG. 3b, the only input signal is the photocurrent intensity feedback $V_{fb}$.

The following can be easily derived:

$$V_{2nd}=V_{fb}+V_{ref},$$

$$V_{bias}=V_0-K*V_{fb},$$

$$V_{out}=V_0-K*V_{fb}-V_{err},$$

$$V_{drop}=K*V_{fb}+V_{err}=K*(V_{2nd}-V_{ref})+V_{err},$$

The overvoltage state indicator $High\ V_0$ is obtained by comparing the voltage $V_{2nd}$ with the reference voltage $V_{ref2}$ through Comparator 2. A high-threshold reference voltage $V_{ref2}$ is set, $V_{ref2}>V_{ref}$; if the value of $V_{2nd}$ is higher than $V_{ref}$, the overvoltage state indicator signal $High\ V_0$ is generated as an output. Now the difference between $V_{drop}$ and its upper target limit $V_{drop\_max}=K*(V_{ref2}-V_{ref})+V_{err}$.

Figure 3C:
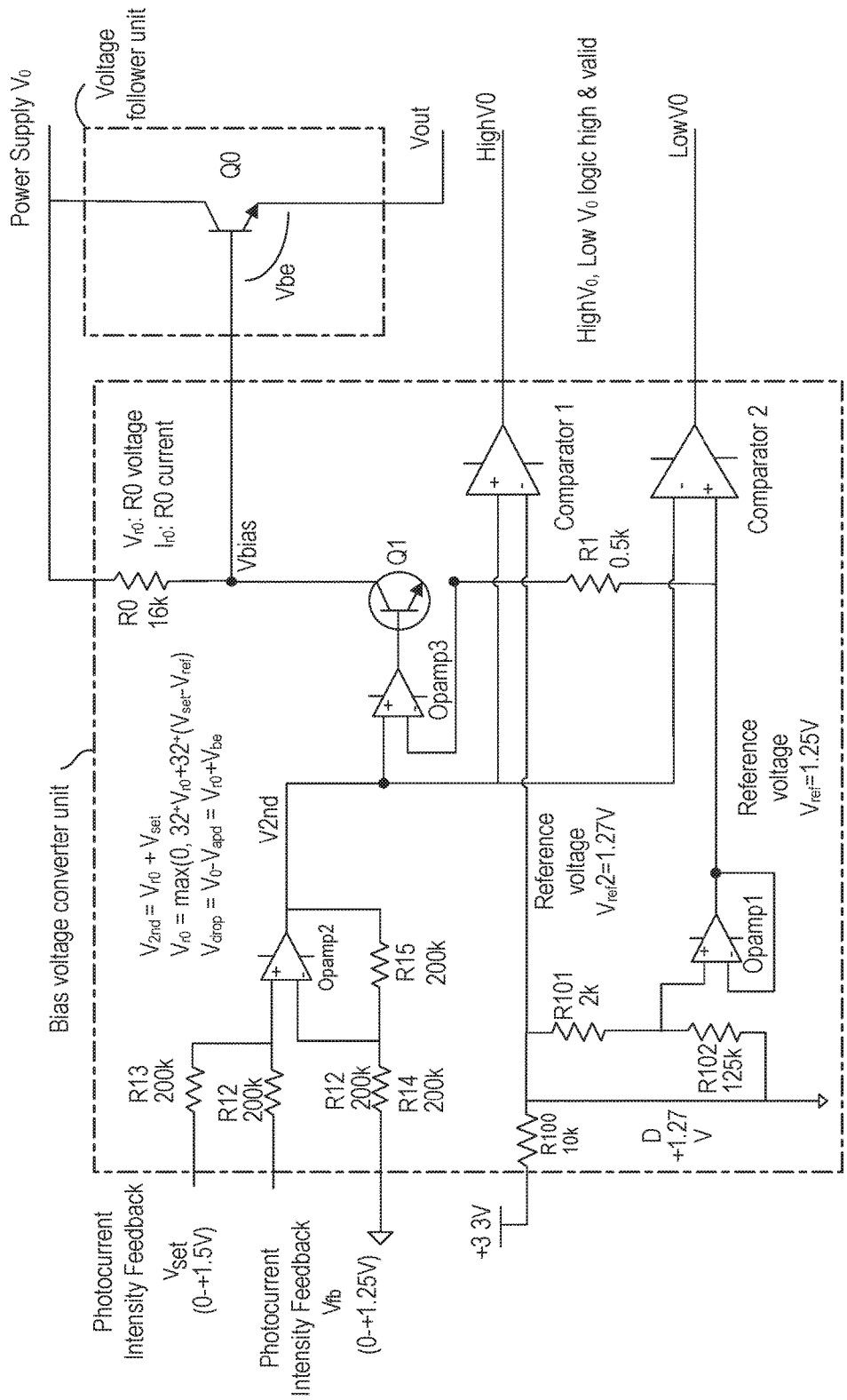
FIG. 3c shows a circuit diagram for an embodiment of the low-power APD bias controller in an application.

FIG. 3c shows a circuit diagram for an embodiment of the photocurrent APD feedback bias controller according to embodiments of the present disclosure. A detailed description is provided below in an embodiment. In this figure, input signals include the bias setting signal $V_{set}$ (0-+2.5V), the photocurrent intensity feedback $V_{fb}$ (0-+1.25V), the baseline voltage input 3.3V, and power supply $V_0$. According to the circuit in the figure, we can obtain the following:

Resistor R100 and voltage regulator D form a 1.27V voltage regulator circuit, and a 1.25V reference voltage is generated with voltage dividers R101 and R102, thus:
The low-threshold reference voltage $V_{ref}=1.25V$; and
The high-threshold reference voltage $V_{ref2}=1.27V$.
Operational amplifier Opamp1 and resistors R12, R13, R14, and R15 form an adder, thus:

$$V_{2nd}=V_{fb}+V_{set}$$

Operational amplifier Opamp3 and PNP BJT Q1 form a V/I converter, and the current through resistors R0 and R1 is approximately equal, thus:
When $V_{2nd}>=1.25V$, $V_{bias}=V_0-(V_{2nd}-V_{ref})*R1/R0$, according to the resistance as shown, $K=R1/R0=16K/0.5K=32$;
When $V_{2nd}<1.25V$, Q1 is turned off, $V_{bias}=V_0$ The voltage follower unit is realized through PNP BJT Q0, whose output voltage is:
$V_{out}=V_{bias}-V_{be}$, where $V_{be}$ is the voltage difference between the base terminal and emitter terminal of Q0 and can be considered as a constant; let $V_{be}$ be 0.5V, $V_{out}$ changes as $V_{bias}$ changes.
Further:

$$V_{drop} = V_0 - V_{out}$$
$$= \begin{cases} Vfb*32+0.5+(Vset-1.25)*32, & (V2nd \geq 1.25\ V) \\ 0.5, & (V2nd < 1.25\ V) \end{cases},$$

Comparator 1 compares signal $V_{2nd}$ with the reference voltage $V_{ref}$ to generate $LowV_0$. When $V_{2nd}<1.25V$, $LowV_0$ is valid, and the lower limit of the target $V_{drop}$ applies, i.e., $V_{drop\_min}=V_{be}=0.5V$.

Comparator 2 compares signal $V_{2nd}$ with the reference voltage $V_{ref}2$ to generate $High\ V_0$. When $V_{2nd}>1.27V$, $High\ V_0$ is valid, and the upper limit of the target $V_{drop}$ applies, i.e., $V_{drop\_max}=(1.27-1.25)*32+V_{be}=1.14V$.

Compared to Embodiment 2 described above, the func(x), $V_{drop}$ function, and its target interval are the same, i.e., $func(x)=32*V_{fb}+0.5$, while $V_{drop}$ is as described above.

Below is a description of an embodiment of the bias voltage adjusting device employing the APD bias control method described above.

Figure 4A:
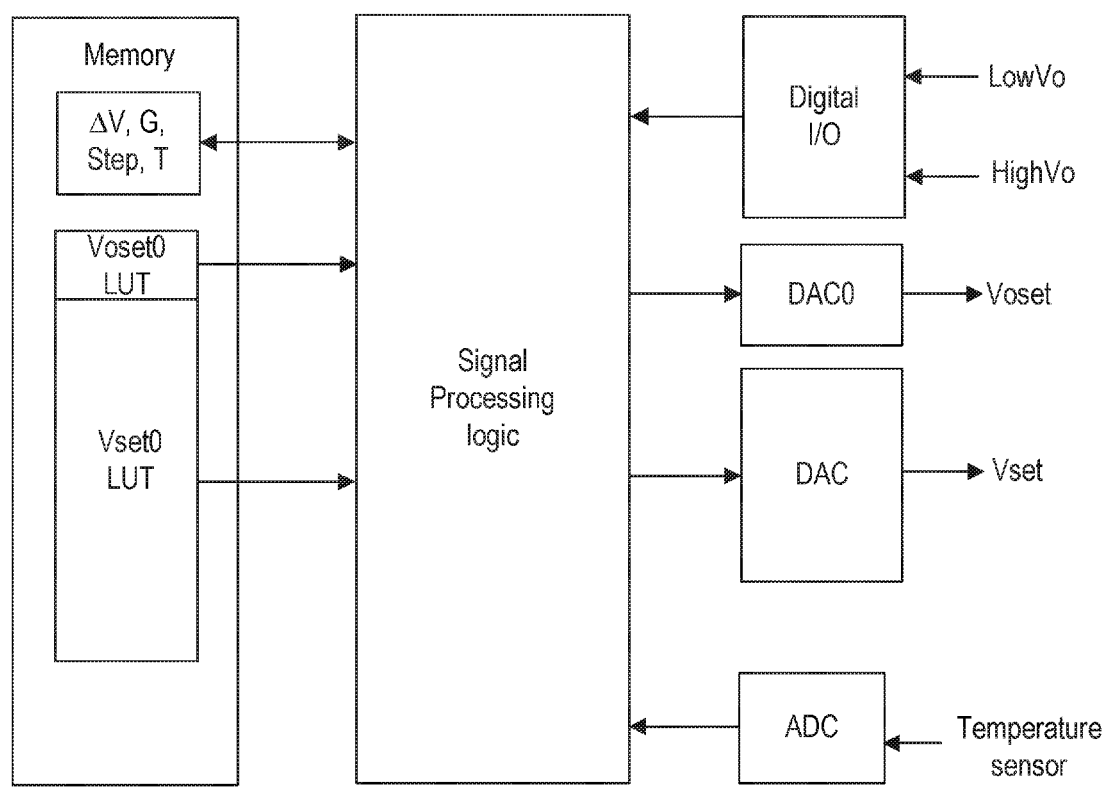
FIG. 4a shows a digital circuit diagram for the low-power APD bias voltage adjusting device.

FIG. 4a shows a digital circuit diagram for the low-power APD bias voltage adjusting device with temperature compensation, including:

1) An internally-placed temperature sensor and corresponding analog-to-digital converter (ADC) for the acquisition of the current operating temperature T for the APD.
2) An internally placed memory, comprising a temperature compensation table LUT and variables table. The temperature compensation LUT is used to store the initial value $V_0set0(T)$ of the power supply voltage setting signal and initial value $V_{set}0(T)$ of the bias setting signal when the temperature T takes different values. The variables table is used to store operating variables, such as the current APD operating temperature T, current bias setting signal deviation $\Delta V$, integration step-length Step, ratio of gains G (i.e. B/A in Formula 16).
3) A digital I/O interface, for the acquisition of overvoltage indicator signal $HighV_0$ and undervoltage indicator signal $LowV_0$.
4) A digital-to-analog converter (DAC), for outputting the current power supply voltage setting signal $V_0set$ and bias setting signal $V_{set}$.
5) Signal processing logic, for the low-power bias voltage adjustment algorithm with temperature compensation.

Figure 4B:
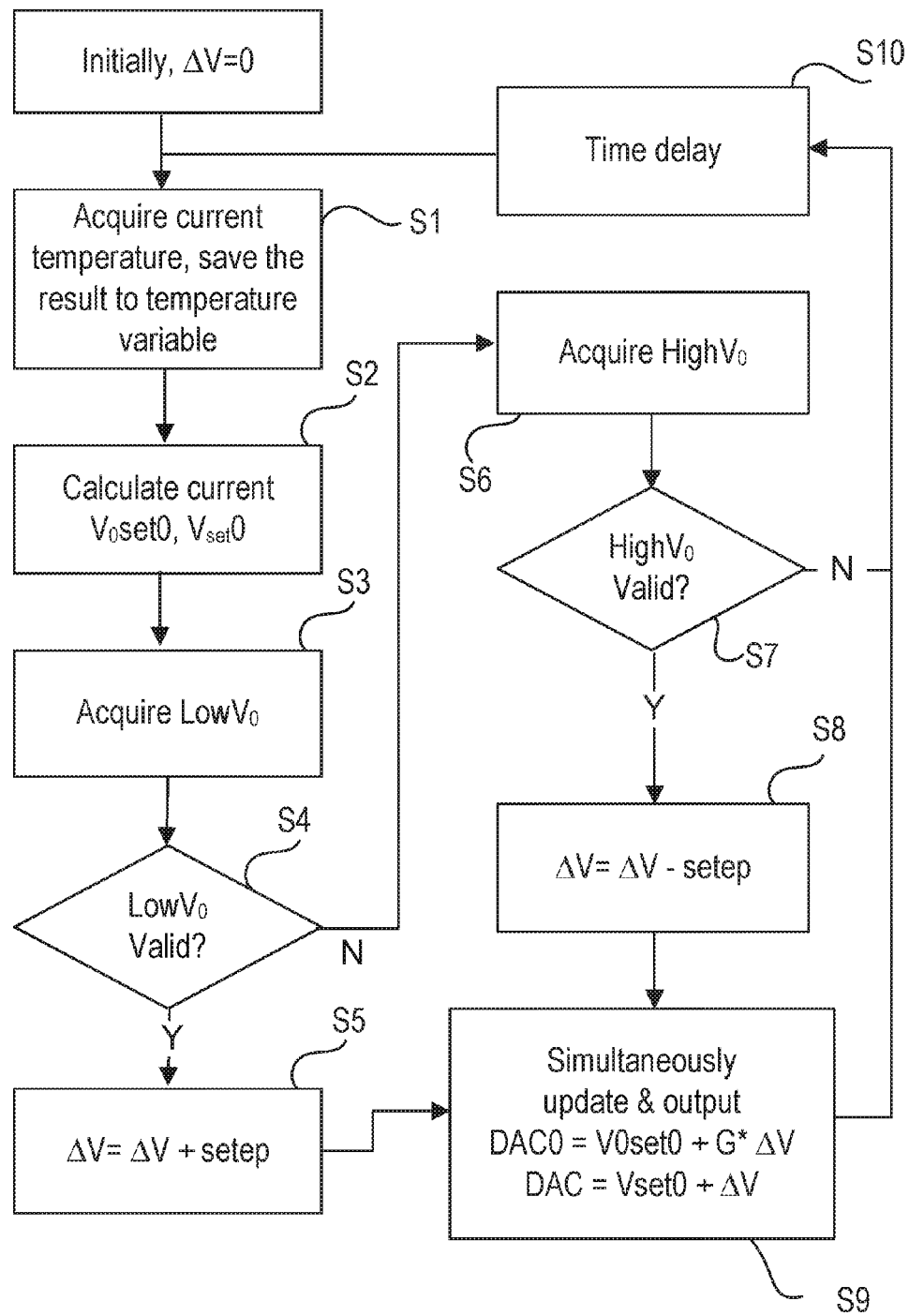
FIG. 4b shows a signal processing logic flowchart for the low-power APD bias voltage adjusting device.

FIG. 4b shows a flowchart for the low-power APD bias voltage adjustment algorithm with temperature compensation. Initially, set $\Delta V=0$, and set $step=(V_{drop\_max}-V_{drop\_min})/(2*B)$ based on the target range for $V_{drop}$, where B is the gain from $V_{set}$ to $V_{drop}$. Then enter the following loop:

At Step 1 (S1), acquire the current temperature and save the result into the temperature variable.
At Step 2 (S2), calculate the initial value $V_0set0$ of the power supply voltage setting signal and the initial value $V_{set}0$ of the bias setting signal based on the value of the temperature variable and the temperature compensation LUT.

At Step 3 (S3), acquire the undervoltage indicator signal $LowV_0$.

At Step 4 (S4), determine whether $LowV_0$ is valid. If $LowV_0$ is valid, i.e. the output is logic high, then go to step 5 (S5). Otherwise, go to Step 6 (S6).

At Step 5 (S5), update $\Delta V=\Delta V+$step, and proceed to Step 9 (S9).

At Step 6 (S6), acquire the overvoltage indicator signal $HighV_0$, and proceed to Step 7 (S7).

At Step 7 (S7), determine whether the overvoltage indicator signal $HighV_0$ is valid. If $HighV_0$ is valid, i.e., $HighV_0$ is logic high, then go to Step 8 (S8). Otherwise, go to Step 10 (S10).

At Step 8 (S8), update $\Delta V=\Delta V-$ step, and proceed to Step 9 (S9).

At Step 9 (S9), simultaneously update DAC0 and DAC, $DAC0=V_0set0+G*\Delta V$, and $DAC=V_{set}0+\Delta V$, and proceed to Step 10 (S10).

At Step 10 (S10), time delay. Then go to Step 1 (S1).

Multiple low-power APD bias controllers based on embodiments of the present disclosure may be suited to be integrated, for example, into the same integrated circuit (IC), to provide bias control for multiple APDs, and to provide overload protection, independent precise bias setting, low power within the entire range of optical receiving power, fast response, temperature compensation, and other functions to multiple APDs.

As shown in FIG. 1a, the APD bias controller 12 and bias voltage adjusting unit 13, adjustable power supply 15, power supply switchover unit 17, auxiliary power supply 16, photocurrent detecting unit 18 can be independent from one another, or integrated into a whole to form a complete APD bias controller. The APD bias controller, APD, and TIA can be packaged together to form a complete APD photoelectric receiver, whose operating principle is as described above and the details will not be repeated here.

It should be understood that despite the descriptions of embodiments, there is not only one independent technical design for each embodiment. The disclosure is written simply for the purpose of clarity. Technical personnel in the field should treat the disclosure as a whole. The technical designs in various embodiments may be combined in appropriate ways to form other embodiments that can be understood by technical personnel in the field.

The series of detailed descriptions above are only intended to provide specific descriptions of feasible embodiments. The detailed descriptions are not to be construed as limiting the scope of protection for the disclosure. All equivalent embodiments or changes that are not detached from the techniques of the disclosure in essence should fall under the scope of protection of the disclosure.

What is claimed is:

1. An avalanche photodiode (APD) bias control method, comprising:
   acquiring a photocurrent intensity voltage;
   generating a control signal by superposing the acquired photocurrent intensity voltage and a bias setting signal, wherein the control signal controls a voltage drop between an adjustable power supply and the APD;
   adjusting an adjustable power supply output voltage that is output from the adjustable power supply and the bias setting signal simultaneously so that the voltage drop is within a target voltage drop range and a bias voltage applied across the APD approaches a target bias voltage that corresponds to an optical input power of an incident light that reaches the APD.

2. The method of claim 1, wherein the bias setting signal adjusts the voltage drop independent from the photocurrent intensity voltage, and wherein an increase of the bias setting signal or the photocurrent intensity voltage corresponds to an increase of the voltage drop.

3. The method of claim 1, further comprising:
   selecting a typical operating temperature point within an operating temperature range of the APD;
   setting, at the typical operating temperature point, a value of the adjustable power supply output voltage and a value of the bias setting signal, wherein the value of the adjustable power supply output voltage and the APD operating temperature have a first relationship, and the value of the bias setting signal and the APD operating temperature have a second relationship;
   acquiring a current APD operating temperature point;
   determining, based on the first and second relationships, an initial value of the adjustable power supply output voltage and an initial value of the bias setting signal at the current APD operating temperature; and
   controlling the voltage drop based on the initial value of the adjustable power supply output voltage and the initial value of the bias setting signal.

4. The method of claim 3, further comprising:
   setting the APD optical input power slightly below a sensitivity target;
   changing the adjustable power supply output voltage;
   adjusting the bias setting signal to control the voltage drop to a target voltage drop;
   measuring a bit error rate;
   identifying the power supply output voltage and bias setting signal corresponding to a lowest bit error rate; and
   setting the identified power supply output voltage as the initial adjustable power supply output voltage, and the identified bias setting signal as the initial bias setting signal.

5. The method of claim 1, further comprising:
   generating an undervoltage signal when the voltage drop is smaller than the target voltage drop range; and
   generating an overvoltage signal when the voltage drop is greater than the target voltage drop range.

6. The method of claim 1, further comprising:
   connecting an auxiliary power supply to the APD when the voltage drop is lower than a lowest value of the target voltage drop range; and
   disconnecting the auxiliary power supply when the voltage drop is higher than or equal to the lowest value of the target voltage drop range.

7. An avalanche photodiode (APD) bias controller, comprising:
   a bias voltage generator configured to generate:
     a bias voltage that determines the APD bias voltage based on an external photocurrent intensity feedback signal, and
     a second voltage signal,
   wherein the bias voltage generator comprises:
     a comparator configured to compare the second voltage signal to one or more reference voltages to generate an undervoltage or overvoltage indicator, where the undervoltage indicator indicates that a current output voltage of an adjustable power supply is too low, and the overvoltage indicator indicates that the current output voltage of the adjustable power supply is too high.

8. The controller of claim 7, wherein the bias voltage generator comprises a bias setting signal port, and the bias setting signal sets a level of the bias voltage independent from the photocurrent intensity feedback signal.

9. The controller of claim 7, further comprising:
a voltage follower with a first port that provides a connection to the adjustable power supply, a second port that provides a voltage to an APD load circuit, and a third port for receiving an input voltage.

10. The controller of claim 7, further comprising:
a bias voltage adjuster configured to generate a control signal based the undervoltage indicator or the overvoltage indicator, wherein the control signal controls the output voltage of the adjustable power supply.

11. The controller of claim 10, wherein the control signal controls and stabilizes the bias voltage by controlling the output voltage of the adjustable power supply.

12. The controller of claim 7, further comprising:
a power supply switchover circuit configured to connect an auxiliary power supply to the APD and disconnect the auxiliary power supply from the APD based on the undervoltage indicator, wherein the adjustable power supply is the sole power supply for the APD when the auxiliary power supply is disconnected.

13. The controller of claim 7, further comprising:
a temperature compensator configured to increase or decrease the bias voltage based on temperature, and to provide temperature compensation to the bias voltage to maintain an optimal bias voltage within an operating temperature range.

14. An avalanche photodiode (APD) photoelectric receiver, comprising:
a voltage follower with a first port that provides a connection to an adjustable power supply, a second port that provides a voltage to an APD load circuit, and a third port that receives an input voltage;
a bias voltage generator configured to generate:
a bias voltage that determines an APD bias voltage based on an external photocurrent intensity feedback signal; and
a second voltage signal,
wherein the bias voltage generator comprises:
a comparator configured to compare the second voltage signal to one or more reference voltages to generate an undervoltage or overvoltage indicator, wherein the undervoltage indicator indicates that a current voltage of the adjustable power supply is too low, and the overvoltage indicator indicates that the current voltage of the adjustable power supply is too high.

15. The receiver of claim 14, wherein the bias voltage generator comprises a bias setting signal port, and the bias setting signal sets a level of the bias voltage independent from the photocurrent intensity feedback signal.

16. The receiver of claim 14, further comprising:
a bias voltage adjuster configured to generate a control signal based on the undervoltage or overvoltage indicator, wherein the control signal controls and stabilizes the bias voltage in the process of controlling the voltage of the adjustable power supply.

17. The receiver of claim 14, further comprising:
an auxiliary power supply; and
a power supply switchover circuit configured to connect the auxiliary power supply to the APD and disconnect the auxiliary power supply from the APD based on the undervoltage indicator, wherein the adjustable power supply is the sole power supply for the APD when the auxiliary power supply is disconnected.

18. The receiver of claim 14, further comprising:
a temperature compensator configured to increase or decrease the bias voltage based on temperature, and to provide temperature compensation to the bias voltage that maintains an optimal bias voltage within an operating temperature range.

* * * * *

UNITED STATES PATENT AND TRADEMARK OFFICE
CERTIFICATE OF CORRECTION

PATENT NO. : 10,193,635 B2
APPLICATION NO. : 15/070400
DATED : January 29, 2019
INVENTOR(S) : Xiangzhong Wang Page 1 of 1

It is certified that error appears in the above-identified patent and that said Letters Patent is hereby corrected as shown below:

In the Claims

In Claim 10, Column 21, Line 11-12, "a control signal based the undervoltage indicator" should read as --a control signal based on the undervoltage indicator--

Signed and Sealed this
Sixteenth Day of April, 2019

Andrei Iancu
*Director of the United States Patent and Trademark Office*